United States Patent [19]

Fisli

[11] 4,259,370
[45] Mar. 31, 1981

[54] PROCESS FOR PROVIDING HIGH SPEED MULTI-FACETED INJECTION MOLDED POLYGONAL SCANNERS EMPLOYING AN ADHESION PROMOTING OVERCOATING FOR SUBSTANTIALLY APPLIED THIN FILM COATINGS

[76] Inventor: Tibor Fisli, 26018 Todd La., Los Altos Hills, Calif. 94022

[21] Appl. No.: 687,962

[22] Filed: May 19, 1976

[51] Int. Cl.³ .................... G02B 5/08; G02B 5/04; H04N 3/08
[52] U.S. Cl. ................................ 427/162; 427/250
[58] Field of Search ............... 427/248 J, 250, 164, 427/166, 167, 163, 162; 428/66; 350/7, 320, 288

[56] References Cited

U.S. PATENT DOCUMENTS

| 2,456,241 | 12/1948 | Axler | 427/166 |
|---|---|---|---|
| 3,087,201 | 4/1963 | Williams et al. | 264/275 X |
| 3,450,465 | 6/1969 | Prance et al. | 350/288 X |
| 3,607,457 | 9/1971 | Hagg et al. | 427/162 X |
| 3,687,713 | 8/1972 | Adams | 350/288 UX |
| 3,848,087 | 11/1974 | Carrell | 350/7 X |

OTHER PUBLICATIONS

Powell et al., *Vapor Deposition*, p. 556 (1966).

*Primary Examiner*—James R. Hoffman

[57] ABSTRACT

A magnesium fluoride or Inconel adhesion promoting overcoat is applied to an injection molded acrylic polygon having a multiplicity of smooth facet faces in order to apply a subsequent reflective thin coating such as aluminum to the polygonal faces. The multi-faceted high speed polygonal scanner thus provided is employed in flying spot scanning applications. The system thus provided is found to involve low cost production and to provide high quality scanning devices.

3 Claims, 2 Drawing Figures

PROCESS FOR PROVIDING HIGH SPEED MULTI-FACETED INJECTION MOLDED POLYGONAL SCANNERS EMPLOYING AN ADHESION PROMOTING OVERCOATING FOR SUBSTANTIALLY APPLIED THIN FILM COATINGS

BACKGROUND OF THE INVENTION

Multi-faceted scanners usually comprising multi-faceted rotating mirrors are employed in well known techniques for erecting optical scanning between a light source and a photocell. Typically, a light illuminates a silvered mirror, for example, at an angle of 45° to direct light toward a facet that is reflected from the facet toward the object being scanned. Normally the object reflects this light back along the same path upon a photocell. The duration of the scan corresponds to the time for a facet to pass the light beam along the object being scanned. It is usually preferred that the object path scanned is independent of which facet is then in the light beam path.

In connection with television equipment, it is known to use mirror prisms for image scanning along one dimension, usually for line scanning. Since the advent of television, cameras operating in accordance with the image storage system, the need for such mirror prisms has become greatly increased. Recently television cameras have been designed for operation within the infrared radiation range, for example, within the range of 2 to 5.5 microns. Television cameras operating within this wave-length require mirrors or similar light deflecting optical means for scanning an image. Usually one means, for instance, a light deflecting mirror, is used for vertical scanning image division. Rotary mirror prisms which are generally prisms composed of several plane mirrors such as glass mirrors are conventionally employed by suitably mounting them on a shaft or other rotary support. These mechanically composed rotary prisms are found to have many disadvantages, both as to their optical characteristics and their mechanical reliability. In particular, they have been found mechanically difficult to mount the several planed mirrors so that they accurately form a polygonal shape of predetermined dimensions. For short optical path lengths, slight misalignment of the facets is found to be of little practical significance. However, when the distance between the scanning mirror and the object being scanned is many feet, slgiht misalignment of the facets results in the path of scan changing from one facet to the other. Such a result is especially disadvantageous when scanning labels with an encoded stripe arrangement. If there is misalignment of the facets one facet might make a perfect scan of the coded stripes while the next facet would register no scan at all or only scan a few of the stripes.

Morever, it is difficult to mount the mirrors so that they accurately retain their spatial positions when subjected to the stresses of high speed rotation. The last mentioned mounting problem entails a danger of injury to persons close to the spinning mirror prism which is often unavoidable. Obviously when the mirror prism should disintegrate shrapnel is produced which may cause serious injury to a bystander.

Thus, many methods have been investigated to produce multi-faceted scanners so that the materials from which they are composed would have high modulus to density ratio, low thermal expansion, low Poisson's ratio, good workability and possess the ability to be readily polishable or coatable with a substance which in turn can be polished to produce high quality optical surfaces. Unfortunately, the imposition of these material restrictions result in the requirement of a material which is not readily available. Presently, in view of these material restrictions and limitations, scanners are now being manufactured from glass, stainless steel, beryllium and chromium carbide. The latter two materials are the most widely used since they more nearly meet the requirements of the predicated material limitations. Of these two, beryllium is found to best satisfy the material requirements of the predicated material limitations and consequently is found to perform in a superior fashion when employed. However, the use of beryllium to provide multi-faceted scanners in and of itself results in still other problems among which are exorbitant cost of the material and the extreme difficulty of working the material into the desired configurations. Chromium carbide scanners, although not as expensive as beryllium scanners, possess very high density and therefore require in the overall general construction of the scanner a driver motor and bearings which are much heavier and much more costly to provide.

There is therefore a demonstrated need to provide multi-faceted scanner systems which may be precisely machined, inexpensively, and with great facility than known scanner systems enabling these multi-faceted scanners to be considered for employment in a vast number of applications other than military or development laboratories where the exorbitant costs of currently available scanner systems can only be justified.

It is therefore an object of this invention to provide a novel multi-faceted scanning system devoid of the above noted deficiencies.

It is another object of this invention to provide a novel multi-faceted scanner capable of operation at high rotational speeds.

It is another object of this invention to provide a novel multi-faceted scanner system characterized by precise alignment of the facets.

Another object of this invention is to provide a novel scanning system which achieves precise alignment of the different facets with techniques that are relatively easy to perform.

Injection molded acrylics have been used for the production of low cost, high quality lenses for many years. However, it has not been practical to employ acrylics in reflecting optics, for example, mirrors, due to their low adhesion to thin film coatings such as aluminum, silver, gold and the like.

There is therefore a demonstrated need to provide a system for employing injected molded acrylics to provide rotating high speed mirror scanners.

These and other objects of the system of the instant invention are accomplished generally speaking by providing an adhesion promoting overcoat magnesium fluoride or Inconel, an alloy of nickel, chromium, and iron on an injection molded acrylic polygon having a multiplicity of smooth facet faces which provides good adhesion to subsequently applied reflective thin coatings such as, for example, aluminum onto the polygon. Heretofore it has not been possible to polish an aluminum workpiece in order to provide a satisfactory reflective facet surface useful in high speed multi-faceted scanners. However, it is possible to vapor deposit aluminum in a mirror-like fashion with the use of a magnesium fluoride overcoat on an acrylic substrate. Vapor deposited aluminum possesses the mirror-like quality required for high-speed multi-faceted scanners. The reflective metallic coating thus provided may also be provided with an overcoating of silicon monoxide which serves as a protective layer.

The magnesium fluoride coating is found to provide excellent adhesion to both the acrylic and subsequently applied metallic films, thus providing the necessary bonding between these surfaces.

The coated polygon multi-faceted scanner thus provided is placed in a conventional high-speed scanning system and is found to be capable of rotating at up to about 50,000 rpm.

The general premise of the system of the instant invention having been described, the specifics of the system of the instant invention will be more clearly understood with reference to the drawings of which:

Figure 1:
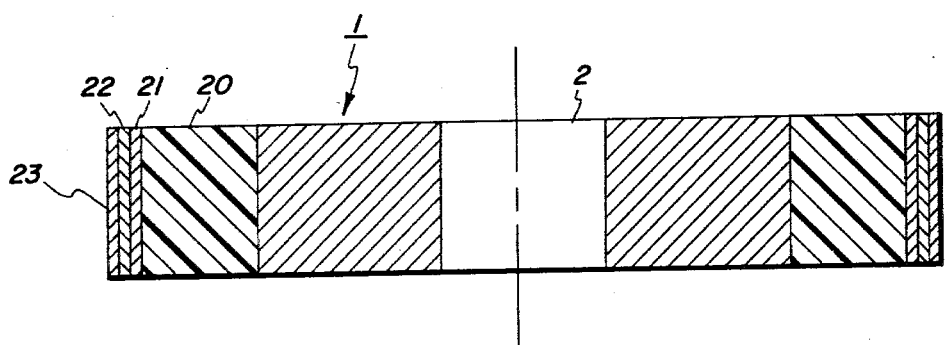
FIG. 1 illustrates a typical cross-section of a scanner as produced in the system of the instant invention.

In FIG. 1 is seen an acrylic substrate 20 over which is coated a magnesium fluoride adhesive overcoating 21. Aluminum 22 is vapor-deposited over the adhesive magnesium fluoride overcoating 21 and thereafter a protective layer of silicon monoxide 23 is placed over the aluminum.

Figure 2:
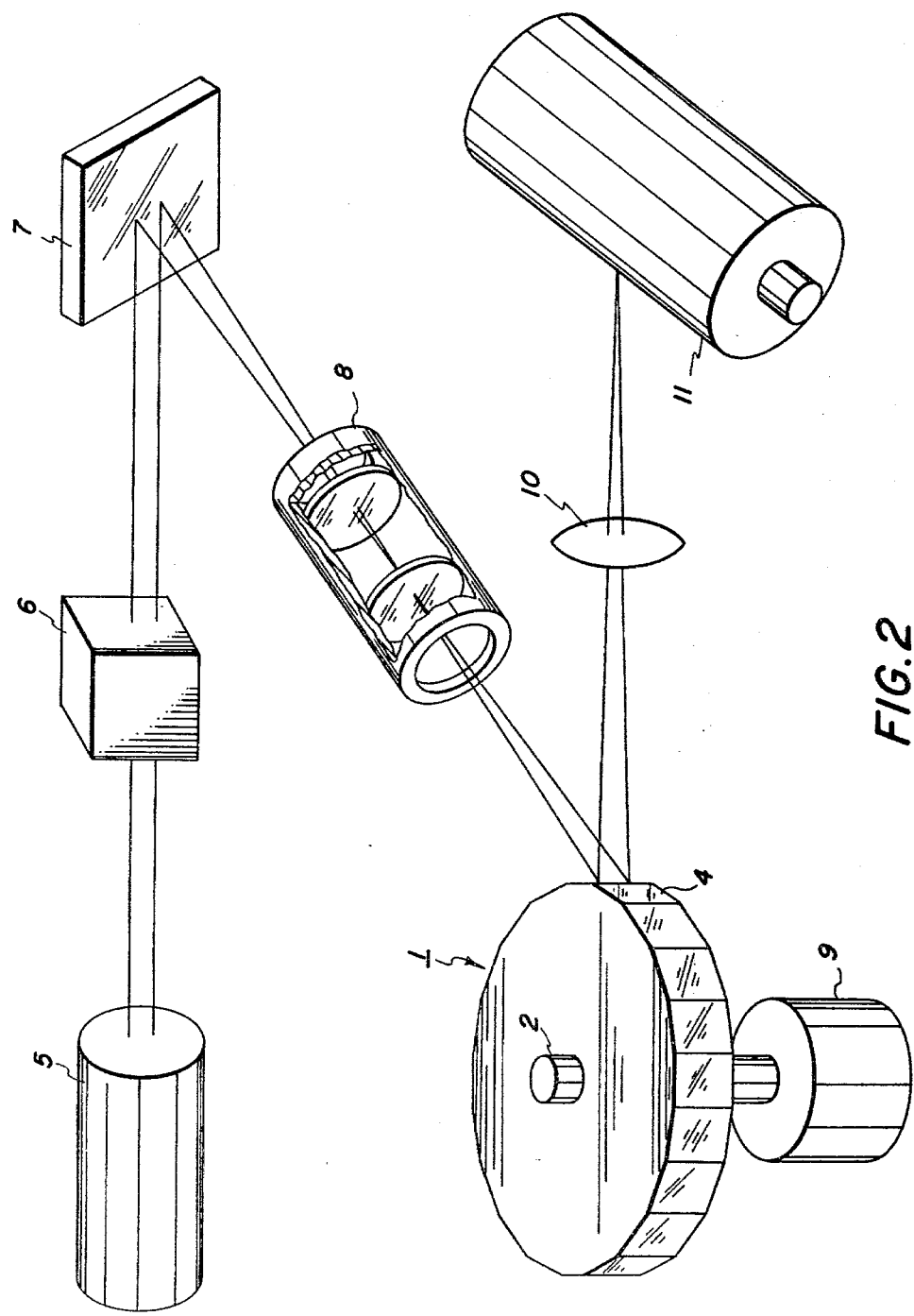
FIG. 2 illustrates a typical application of the scanners produced in accordance with the principle of the instant invention.

In FIG. 2 is seen a conventional high speed scanning system employing the polygonal multi-faceted scanner produced in accordance with the process of the instant invention.

In FIG. 2 a laser 5 emits light through a modulator 6 which is reflected by a mirror 7 to a beam expander 8. The expanded beam impinges on the facets 4 of scanner 1 which are rotated at high speed by motor 9 via shaft 2. The scanned beam then passes through a focusing lens 10 and is directed to the photoreceptor surface 11.

Any suitable acrylic may be used in the system of the instant invention. Typical acrylics include V920 by ROHM & HAAS among others. Any suitable conventional method may be employed to vapor deposit the aluminum on the adhesive coating. Typical such methods of vapor deposition include the application of any suitable metal medium to the adhesive overcoat of the instant invention. Typical such metals include aluminum, gold, silver, etc.

Any suitable method of coating the magnesium fluoride or Inconel adhesive to the acrylic substrate may be employed. Typical methods of coating include vacuum deposition of said metals by heating them above their melting point among others.

Any suitable method of injection molding may be employed in providing the molded acrylic of the system of the instant invention. Typical methods of injection molding include forcing molten acrylic into a die-cavity having the required geometry and precision, or other suitable conventional methods.

The facet geometry of the molded acrylic polygon is provided employing any suitable method. Typical methods include the use of highly polished metal inserts which are placed and held in the die-cavity in a very precise manner employing conventional techniques. The surfaces of these inserts provide the necessary geometry to the acrylic ring when the molten acrylic is forced into and held under pressure in the die-cavity. After the die is cooled, the part is removed.

The molded acrylic multi-faceted high speed scanner thus produced may be employed in any conventional high speed scanning application. Typical applications of this system include deflection of a light beam such as laser in such a manner that it produces a "flying spot". When this bright spot is moved across an object-document having high and low density areas by rotation of the scanner, a light detector (placed in the vicinity) provides an electronic signal which is low or non-existent when the spot is in a dark area, and high when the spot is in a light area of the document. This type of scanning system is used in facsimile devices and in optical character readers. Since this system can be used (in conjunction with other hard and software) to decode alpha numerics, it is also known as a "reader". Another system which also uses multi-faceted scanners is the so-called "write" system. The overall arrangement in general is the same except that in the stationary path of the beam (before the scanner) a light switch known as a modulator is used to "write" the image on a xerographic photoreceptor. The signal going into the modulator can come either from the light detector of the "read" station, or from a character generator which is the case with computer printers.

To further define the specifics of the present invention, the following examples are intended to illustrate and not limit the particulars of the present system. Parts and percentages are by weight unless otherwise indicated.

EXAMPLE I

An acrylic substrate is injection molded employing a conventionally known technique. The precise facet geometry is first provided employing conventional techniques. A 100A° layer of magnesium fluoride is coated on the surface of the acrylic polygon by vacuum deposition to insure the maintenance of the precise geometry that is produced. 1000A° thick aluminum is vapor deposited on the adhesive magnesium fluoride overcoating by placing aluminum in vacuum and heating to the melting temperature of aluminum under a minimum of $5 \times 10^{-6}$ torr vacuum. 200A° of silicon monoxide is then coated over the highly reflective mirror-like aluminum vapor deposited coating maintaining the precise facet geometry. The high speed multi-faceted scanner thus provided is placed into a "read" conventional scanning system and is employed at 3600 rpm to "read" a document on a photoreceptor as hereinbefore described. Scanning speeds of up to 50,000 rpm are employed with great facility.

EXAMPLE II

The process as outlined in Example I is again repeated with the exception that the system is operated in a "write" mode.

What is claimed is:

1. A process for providing a high speed multi-faceted polygonal scanner comprising providing an injection molded acrylic polygon having a multiplicity of facet faces, applying an adhesive promoting magnesium fluoride overcoat to said facet faces, and then applying a reflective thin coating over said coated facet faces to provide a multi-faceted polygonal high speed scanner.

2. The process as defined in claim 1 wherein said reflective coating comprises vapor deposited aluminum.

3. The process as defined in claim 1 wherein a layer of silicon monoxide is coated over said reflective thin coating.

* * * * *